United States Patent
Balachandran et al.

(10) Patent No.: US 6,361,598 B1
(45) Date of Patent: Mar. 26, 2002

(54) METHOD FOR PREPARING HIGH TEMPERATURE SUPERCONDUCTOR

(75) Inventors: Uthamalingam Balachandran, Hinsdale, IL (US); Michael P. Chudzik, Beacon, NY (US)

(73) Assignee: The University of Chicago, Chicago, IL (US)

( * ) Notice: Subject to any disclaimer, the term of this patent is extended or adjusted under 35 U.S.C. 154(b) by 0 days.

(21) Appl. No.: 09/621,272

(22) Filed: Jul. 20, 2000

(51) Int. Cl.[7] .............................................. C30B 25/02
(52) U.S. Cl. ........................ 117/86; 117/84; 117/947; 427/248.1
(58) Field of Search ............................ 117/84, 86, 947; 427/248.1

(56) References Cited

U.S. PATENT DOCUMENTS

| | | |
|---|---|---|
| 4,939,120 A | 7/1990 | Moon et al. |
| 4,956,336 A | 9/1990 | Salama et al. |
| 5,964,966 A | 10/1999 | Goyal et al. |
| 5,968,877 A | 10/1999 | Budai et al. |
| 6,077,344 A * | 6/2000 | Shoup et al. .................. 117/9 |
| 6,235,402 B1 * | 5/2001 | Shoup et al. ............... 428/472 |

OTHER PUBLICATIONS

Critical Current Densities in Superconducting Y–Ba–Cu–O . . . ; Japanese Journal of Applied Physics, vol. 28, No. 9, Sep. 1989, pp. L 1545–L1548.
Superconductivity of $YBa_2Cu_3O_{1-x}$ by Addition of Reactive Fine Powders, Sakai et al. Superconductivity Research Laboratory Oct. 15, 1990.
Processing of Large $YBa_2Cu_3O_x$ Domains For Levitation Applications by a $Nd_{1+x}Ba_{2-x}Cu_3Oy$–Seeded Melt–Growth Technique, Journal of Electronic Materials, vol. 23, No., 11 1994.
Extremely Fine Precipitate and Flux Pinning in Melt–Processed $YBa_2Cu_3O_x$ Physica C 213 (1993) 179–184.

* cited by examiner

Primary Examiner—Felisa Hiteshew
(74) Attorney, Agent, or Firm—Emrich & Dithmar

(57) ABSTRACT

A method of depositing a biaxially textured metal oxide on a substrate defining a plane in which metal oxide atoms are vaporized from a source to form a plume of metal oxide atoms. Atoms in the plume disposed at a selected angle in a predetermined range of angles to the plane of the substrate are allowed to contact the substrate while preventing atoms outside a selected angle from reaching the substrate. The preferred range of angles is 40°–70° and the preferred angle is 60°±5°. A moving substrate is disclosed.

20 Claims, 5 Drawing Sheets

METHOD FOR PREPARING HIGH TEMPERATURE SUPERCONDUCTOR

CONTRACTUAL ORIGIN OF THE INVENTION

The United States Government has rights in this invention pursuant to Contract No. W-31-109-ENG-38 between the U.S. Department of Energy (DOE) and The University of Chicago representing Argonne National Laboratory.

FIELD OF THE INVENTION

The present invention relates to a method of producing substrate material for high temperature superconductors in which the substrate is relatively inexpensive and rapidly produced.

BACKGROUND OF THE INVENTION

Considerable effort has been made in the last few years to create a robust technique for depositing long lengths of biaxially textured oxide films on metallic substrates. This effort has been manifested in a number of techniques such as ionbeam assisted deposition (IBAD), and by inclined-substrate deposition (ISD) from dual magnetron sputtering and pulsed-laser sources, as well as the RABiTS technique, see U.S. Pat. No. 5,968,877 to Budai et al. and others based on work at Oak Ridge National Laboratory. These deposition techniques require costly exciter lasers and/or complex decomposition geometries. Evaporation has long been utilized in industry as a cost-effective deposition method for continuous coating applications. Evaporation is a simple low-cost deposition technique that allows for high deposition rates.

MgO has been used successfully as a buffer layer for YBCO grown on silicon, and metal substrates. The requirement of an assisting ion gun and the addition of an amorphous $Si_3N_4$ buffer layer, make the growth of biaxially textured MgO by IBAD considerably more complex than the simplicity of evaporation on an inclined substrate. Inclined substrate deposition of oxides has played a role in creating biaxial texture in buffer layers for coated conductors, along with IBAD and RABiTS. The major hurdle in bringing these wires to market is the slow deposition rates and complex deposition systems previously required to deposit biaxially textured template layers.

Preferred orientation in MgO films grown on inclined substrates was observed previously, but it wasn't until 1997 that this growth technique was applied to coated conductors. This invention relates to the effects of processing on the in-plane texture of MgO films grown on inclined substrates and the evolution of this texture as it pertains to developing a model for texture-development.

SUMMARY OF THE INVENTION

Biaxially textured magnesium oxide thick films were deposited using electron beam evaporation for template layers in coated conductors. Highly textured films with in-plane FWHM (Full Width Half Maximum) of 10° were deposited at growth rates of 36 $\mu$m/hr on thermally oxidized silicon and nickel-based alloy substrates. These thick films grow off-axis angled towards the atomic flux. The texturing of the MgO is a selective growth process whereby the texture improves with increasing film thickness. This growth process differs from the texturing of MgO using ion-beam assisted deposition (IBAD) which is nucleation controlled and requires an amorphous substrate. It was determined that the in plane texture of the MgO thick films are not dependent on deposition rates from 2.5 to 100 Å/second, making this technique amiable to cost-effective production scale-up. This has important implications on the manufacturing scale-up of YBCO coated tapes.

Accordingly, it is an object of the present invention to provide a method of depositing a biaxially textured metal oxide on a substrate that is inexpensive while at the same time providing deposition rates up to 100 Å/second in order to produce metal oxide layers of about 3 microns thick in minutes as opposed to hours.

Yet another object of the present invention is to provide a method of depositing a biaxially textured metal oxide on either a crystalline or amorphous substrate.

Yet another object of the invention is to provide a method of depositing a biaxially textured metal oxide in which a plume of metal oxide atoms is produced and thereafter the divergence thereof controlled to fabricate biaxially textured oxides with an in-plane Full-Width-Half-Maximum (FWHM) of less than about 28°.

Another object of the present invention is to provide a method of depositing a biaxially textured metal oxide on a substrate defining a plane, comprising vaporizing metal oxide atoms from a source thereof to form a plume of metal oxide atoms, and preferentially passing atoms in the plume disposed at a selected angle in a predetermined range of angles to the plane of the substrate while preventing atoms outside a selected angle from reaching the substrate.

A final object of the present invention is to provide a method of depositing a biaxially textured metal oxide on a substrate defining a plane, providing a substrate supply and a substrate storage, providing a plume of metal oxide atoms from a source of metal oxide, passing substrate from the supply thereof pass the plume of metal oxide atoms, interposing a collimator between the source of metal oxide atoms and the substrate to restrict the metal oxide atoms contacting the substrate to a selected angle within a preselected range of angles, thereby to form a biaxially textured metal oxide on the substrate from atoms contacting the substrate only at a selected angle.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

DESCRIPTION OF THE PREFERRED EMBODIMENT

There are now two leading technologies for producing coated conductors, the so-called second-generation superconductors, namely ion beam assisted deposition (IBAD) and rolling assisted biaxially textured substrates, (RABiTS) processes. In the IBAD process, a biaxially textured layer of metal oxide, typically yttria-stabilizer zirconia-(YSZ), is deposited on a flexible metallic substrate using an ion gun. The YSZ plume is produced by evaporation or by sputtering, and the assisting ion gun is positioned at an angle to the metallic substrate. Typical IBAD deposition rates are about 1.5 Å/seconds. At this slow rate, it takes nearly two hours to obtain a 1 micron thick layer of YSZ. Another buffer layer, typically ceria, is deposited on top of the YSZ layer prior to the deposition and formation of a YBCO superconductor. Los Alamos Laboratory has fabricated a 1 meter long YBCO superconductor by the IBAD technique.

The RABiTS process relies on first producing highly textured metallic substrates by rolling and annealing methods disclosed in the art, for instance see U.S. Pat. No. 5,968,877 to Budai et al. YSZ and ceria layers are deposited on top of the biaxially textured metallic substrate by pulsed laser deposition evaporation, sputtering or other standard techniques. Oak Ridge National Laboratory has disclosed the RABITS technology and has obtained patents thereon. Due to granularity problems in the RABITS process, it is believed that it will be difficult to make long lengths of superconductors with the necessary high critical current by the RABiTS technique.

Figure 1:
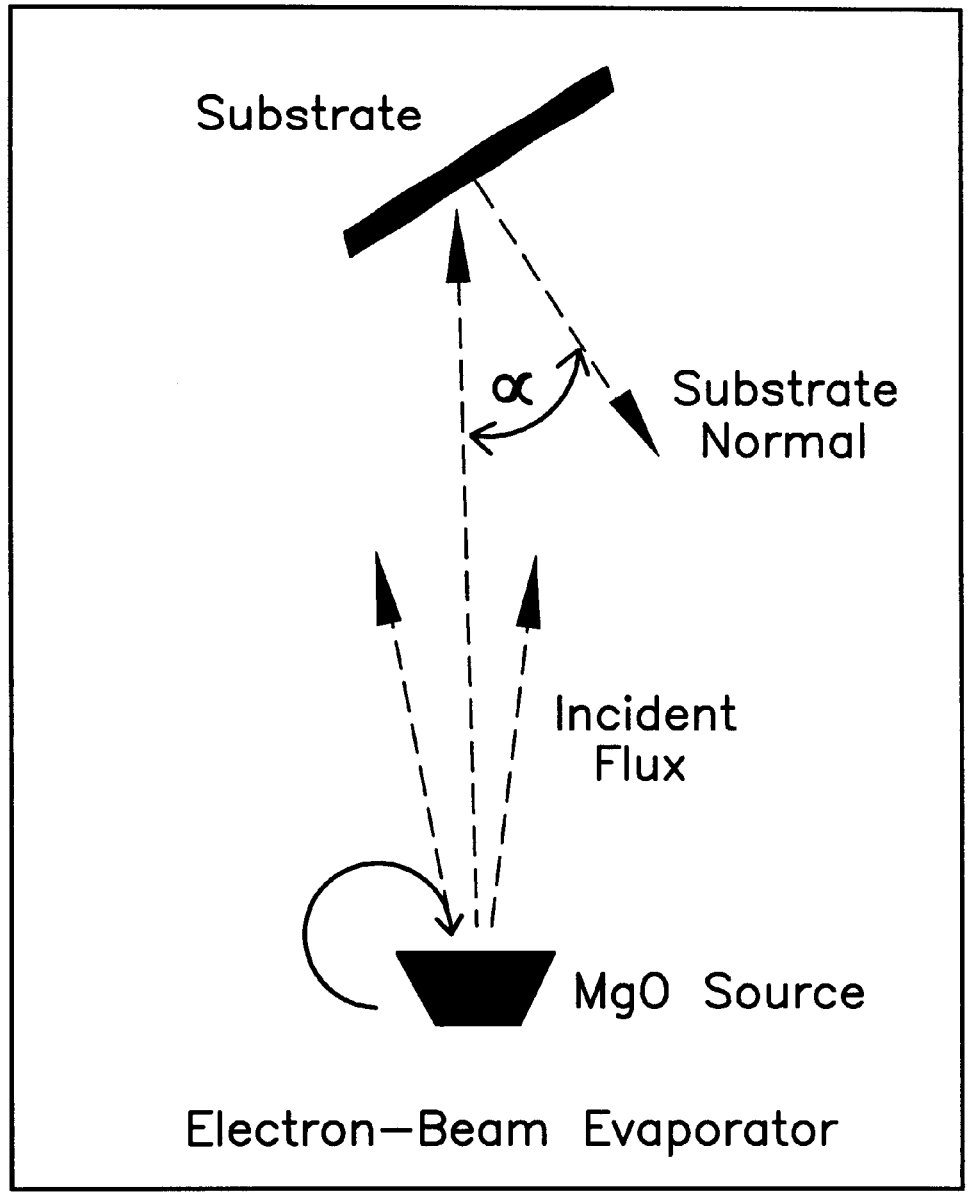
FIG. 1 is a schematic illustration of the inclined substrate deposition method.

Referring now to FIG. 1 of the drawings, there is illustrated a schematic illustration of the inclined substrate method as previously practiced. In the inclined substrate method, a substrate is positioned at an angle a to a plume of flux from an oxide source thereof. As illustrated in FIG. 1, an electron beam evaporator or other suitable and well known vaporization technique can be used to create a plume of incident flux which travels toward a substrate. The angle a is defined as the angle between a line normal to the plane of the substrate and a line perpendicular to the surface of the oxide source. It should be understood that the oxide source may not be a planar surface but the defined angle is referenced to an assumed plane if the oxide source is, for instance, small chucks of material. Preferably for the present invention, the angle of a is maintained in the range of from about 40° to 70° and preferably about 60°±5°. The ±5° will be explained hereafter. Previously, the inclined substrate mentioned has been used before, as shown in FIG. 1. However, it is believed that biaxially textured oxide coatings have not been produced on moving substrates because the plume of oxide atoms diverges as it leaves the source of the oxide and moves toward the substrate. As the plume diverges, the angles at which the oxide atoms contact a moving substrate change until a substantial percentage of the oxide atoms are outside the angular range results in axially textured deposition.

Figure 2:
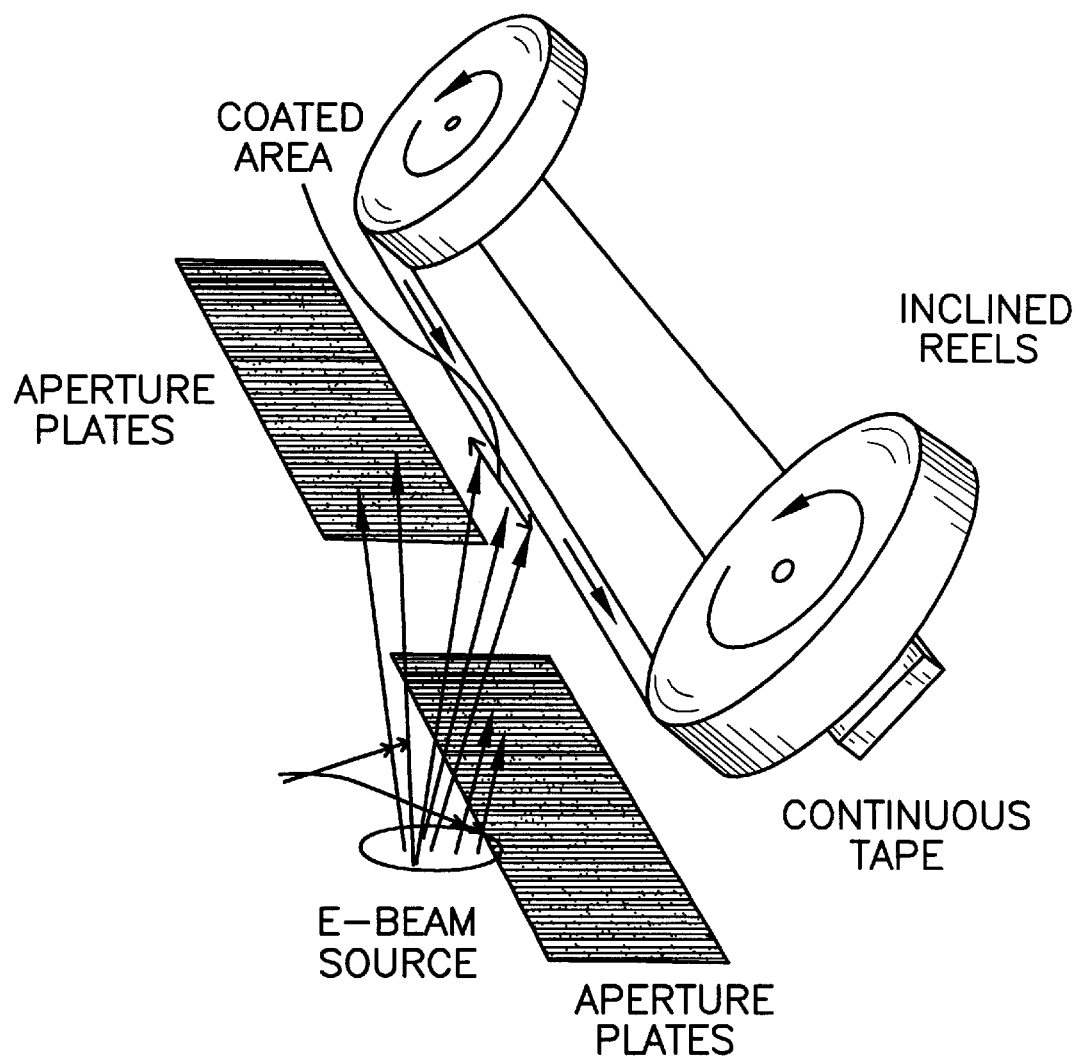
FIG. 2 is a schematic illustration of the inclined substrate deposition method of the present invention.

On the other hand, using the method of present invention illustrated in FIG. 2, we have fabricated 1 meter long biaxially textured magnesium oxide on Hasteolloy (Ni—Cr—Mo alloy) and Inconel (Ni—Cr—V) alloys, these being nickel chromium and nickel vanadium alloys. Moreover, we have provided one meter long tapes with biaxially textured magnesium oxide with a full width half maximum (FWHM) of 28° and less. More specifically, using the method of the present invention, we have provided FWHM measurements on the order of 12° and less. It should be understood that the FWHM measurements are accomplished with X-ray spectrums and, therefore, the average misorientation of the angles of the oxide coatings are measured, however, the misorientation angles of the coating closest to the substrate is greater than the misorientation angles of the surface of the oxide coating. Accordingly, misorientation angles or FWHM values of 20° mean that the misorientation angles at the surface is about 8°. FWHM values of about 28° means that the misorientation angles at the surface are in the 12–13° range.

Generally, any oxide may be available for the process of the present invention provided that the oxide does not adversely react with a superconductor layer to be laid down on top of or formulated on top of the biaxially textured oxide. Representative but not limiting samples of suitable oxides are $MgO$, $SrTiO_3$, $LaAlO_3$, yttria stabilized $ZrO_2$, $PbTiO_3$, $Sr_2RuO_4$, $NdGaO_3$, $LaCrO_3$, $NdCrO_3$, $LaFeO_3$, $NdFeO_3$, $La_2CuO_4$, $RTiO_3$, where R is La or a rare earth, and $GdFeO_3$. Magnesium oxide is preferred because it is inexpensive. The metal substrate may be any face centered cubic material and is preferably flexible and is as thin as possible. It should be understood that $J_c$, the engineering current density, i.e. ability of composite structure consisting of substrate, textured oxide layer and superconductor values are calculated based on the thickness of the material used so that the thinner the metal substrate the better. It is also important that no adverse reaction occur between the metal substrate and the superconductor during the formation of the superconductor which is generally formed at relatively high temperatures by melting oxide or carbonate precursors of the superconductor in situ on the biaxially textured oxide material laid on top of the metal substrate. While Hastealloy and Inconel have been used as substrates, there are a variety of suitable available substrates well known to those of ordinary skill in the art.

Figure 3:
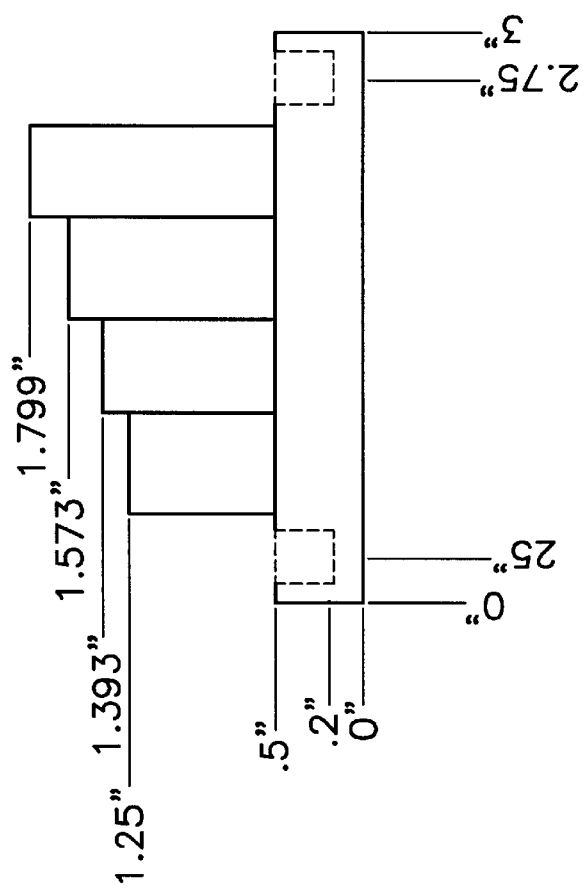
FIG. 3 is a schematic illustration of a portion of the experimental apparatus used to adjust the inclination angle of the substrate relative to the plume of metal oxide atoms.
Figure 3:
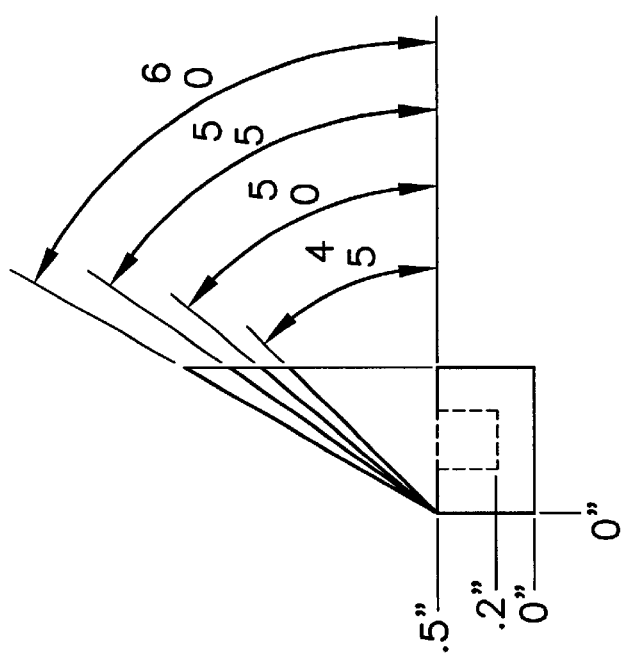

In order to determine the most optimum angle a between the vapor source and the substrate, the apparatus is illustrated in FIG. 3 was used. A chamber was evacuated to $1 \times 10^{-7}$ torr. Additional oxygen was introduced to ensure sufficient oxygen stoichiometry. E)eposition rates varied between 2.5 to 100 Å per second and ISD films were grown to a thickness between 500 Å and 5 microns. The effects of different substrate angles, $\alpha$, on texture were determined using a series of wedges made of copper blocks as illustrated in FIG. 3. The substrate angles were varied between 45° and 60°, in 5° increments. The wedges were placed on variable angle stages set with zero inclination allowing for up to 15 different substrates each at a different angle for each deposition experiment. Only one such block containing 5 angles in increments of 5° is illustrated in FIG. 3.

Figure 4:
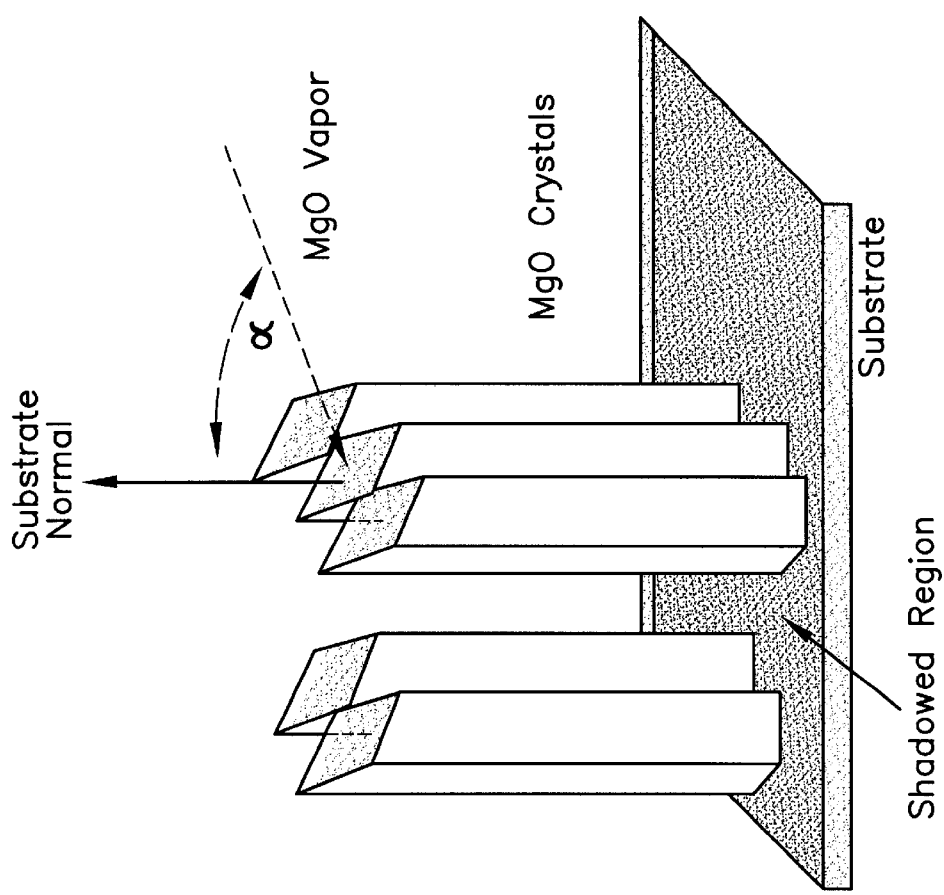
FIG. 4 is a schematic illustration of the instant vapor and columnar growth directions for magnesium oxide crystals.

FIG. 4 is a schematic illustration of the incident vapor and columnar growth directions for deposited magnesium oxide crystals on a substrate. The shadowed region is the self shadowing mechanism which occurs in this process and is the reason that the metal oxide layer has to be thick on the order of about 3 microns in order to obtain good biaxial texture.

In order to limit the angles at which the vaporized oxide atoms strike the substrate, a device as illustrated in FIG. 2 is used. In that device, there is a source of substrate material indicated by the left hand circular supply and a take-up storage device indicated by the right hand wheel. These reels are inclined at an angle with respect to the surface of the oxide source. Oxide atoms are vaporized by means of a variety of well known devices, evaporation being but one is preferred. An electron beam evaporator was used in order to vaporize the magnesium oxide atoms from a source thereof and an apertured plate or collimator was disposed between the source of oxide atoms and the moving substrate. By using an apertured plate or collimator having an opening therein of about 2 inches in diameter, the angle at which the oxide atoms contact the metal tape or substrate can be limited to about ±5° of a preselected angle within the range of from about 40° to about 70°, the preferred range of angles for oxide atoms to strike a moving substrate. Within the above preselected range of angles, it is preferred that the angle at which the metal oxide (MgO) atoms strike the moving substrate is about 60°±5°.

Figure 5:
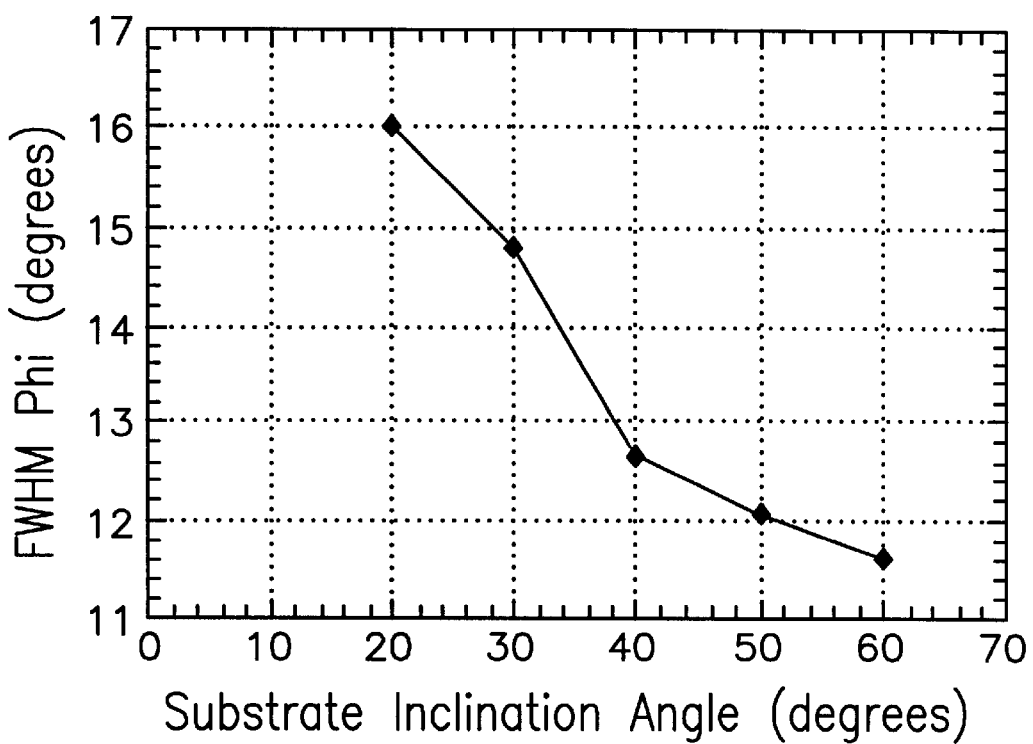
FIG. 5 is a graphical representation of the relationship between FWHM in degrees and the substrate inclination angle in degrees.

Referring to the graph of FIG. 5, it will be seen that using the substrate inclination angle a of about 60° results in an FWHM measurement of about 11.6°. As previously described, this is an average of the misorientation angles of the deposited oxide layer from the juncture of the oxide with the metallic substrate to the exterior surface of the oxide layer. In general, the reel to reel moving substrate may be at a feed rate of about 10 cm per minute resulting in a one meter long tape being produced in about 10 minutes. However, feed rates may vary.

It should be noted that another way to refer to the plume of oxide atoms produced from a source thereof is an atomic flux but the terms as used herein are synonymous.

Accordingly, there has been disclosed a method of producing biaxially textured oxide material on a moving metallic substrate wherein the metallic substrate is moved past the source of oxide atoms at a rate and at a condition sufficient to produce meter long coating tapes in less than about 20 minutes. Preferably, any face centered cubic metal may used on which to deposit the oxide coating and the oxide coating may be selected from a variety of well known materials. The use of a collimator to limit the dispersion of the plume or atomic flux is crucial to the invention.

As is well known in the art, certain oxide such as yttria stabilizer zirconia can not be used with a electron beam evaporation device because the atoms cannot orientate themselves correctly because of insufficient energy. On the other hand, yttria stabilized zirconia can be used with pulse lasers, sputtering and ion gun sources.

While there has been disclosed what is considered to be the preferred embodiment of the present invention, it is understood that various changes in the details may be made without departing from the spirit, or sacrificing any of the advantages of the present invention.

The embodiments of the invention in which an exclusive property or privilege is claimed are defined as follows:

1. A method of depositing a biaxially textured metal oxide on a substrate defining a plane, comprising vaporizing metal oxide atoms from a source thereof to form a plume of metal oxide atoms, and preferentially passing atoms in the plume disposed at a selected angle in a predetermined range of angles to the plane of the substrate while preventing atoms outside a selected angle from reaching the substrate.

2. The method of claim 1, wherein the selected angle is measured from a line normal to the plane of the substrate to the direction of travel of the atoms and is in a predetermined range of angles from about 40° to about 70°.

3. The method of claim 2, wherein the selected angle is greater than about 60°±5°.

4. The method of claim 2, wherein the metal oxide is one or more of MgO, $SrTiO_3$, $LaAlO_3$, yttria stabilized $ZrO_2$, $PbTiO_3$, $Sr_2RuO_4$, $NdGaO_3$, $LaCrO_3$, $NdCrO_3$, $LaFeO_3$, $NdFeO_3$, $La_2CuO_4$, $RTiO_3$, where R is La or a rare earth, and $GdFeO_3$.

5. The method of claim 2, wherein the metal oxide is MgO.

6. The method of claim 2, wherein the metal oxide atoms are vaporized with a pulsed laser or an ion gun or an electron beam evaporator.

7. The method of claim 1, wherein the atoms in the plume reaching the substrate are within ±5° of a selected angle.

8. The method of claim 1, wherein the substrate is a flexible metal.

9. The method of claim 8, wherein the substrate is a nickel based alloy.

10. The method of claim 9, wherein the nickel based alloy is a Ni—Cr or a Ni—V alloy.

11. The method of claim 1, wherein the substrate is $SiO_2$.

12. The method of claim 1, wherein the biaxially textured metal oxide on the substrate is MgO and does not exceed about 3 microns in thickness.

13. A method of depositing a biaxially textured metal oxide on a substrate defining a plane, comprising providing a substrate supply and a substrate storage, providing a plume of metal oxide atoms from a source of metal oxide, passing substrate from the supply thereof past the plume of metal oxide atoms, interposing a collimator between the source of metal oxide atoms and the substrate to restrict the metal oxide atoms contacting the substrate to a selected angle within a preselected range of angles, thereby to form a biaxially textured metal oxide on the substrate from atoms contacting the substrate only at a selected angle.

14. The method of claim 13, wherein the selected angle is measured from a line normal to the plane of the substrate to the direction of travel of the atoms and is in a predetermined range of angles from about 40° to about 70°.

15. The method of claim 14, wherein the selected angle is 60°±50.

16. The method of claim 14, wherein the metal oxide atoms are vaporized by an e-beam evaporator.

17. The method of claim 16, wherein the substrate is a metal and the biaxially textured oxide is deposited at a thickness less than about 3 microns.

18. The method of claim 17, wherein the oxide is MgO.

19. The method of claim 18, wherein the collimator is an apertured plate.

20. The method of claim 19, wherein the substrate is a nickel based alloy.

* * * * *

UNITED STATES PATENT AND TRADEMARK OFFICE
CERTIFICATE OF CORRECTION

PATENT NO. : 6,361,598 B1
DATED : March 26, 2002
INVENTOR(S) : Uthamalingam Balachandran and Michael P. Chudzik It is certified that error appears in the above-identified patent and that said Letters Patent is hereby corrected as shown below:

Column 3,
Lines 32 and 33, delete "RABITS" and insert -- RABiTS --
Line 48, in between "angle" and "is" delete the space and insert the symbol -- $\propto$ --

Column 6,
Line 47, delete "$\pm 50$" and insert -- $\pm 5°$ --

Signed and Sealed this

Eleventh Day of June, 2002

Attest:

Attesting Officer

JAMES E. ROGAN
*Director of the United States Patent and Trademark Office*